(12) United States Patent
Hardin et al.

(10) Patent No.: US 9,023,177 B2
(45) Date of Patent: *May 5, 2015

(54) ANCHORING INSERTS, ELECTRODE ASSEMBLIES, AND PLASMA PROCESSING CHAMBERS

(75) Inventors: Randall Hardin, Miamisburg, OH (US); Jonathan Keihl, Versailles, OH (US); Duane Lytle, Vandalia, OH (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/443,307

(22) Filed: Apr. 10, 2012

(65) Prior Publication Data

US 2012/0193449 A1 Aug. 2, 2012

Related U.S. Application Data

(63) Continuation of application No. 12/409,984, filed on Mar. 24, 2009, now Pat. No. 8,187,414, which is a continuation-in-part of application No. 11/871,586, filed on Oct. 12, 2007, now Pat. No. 8,152,954.

(51) Int. Cl.
*F16B 21/00* (2006.01)
*H01L 21/306* (2006.01)
(Continued)

(52) U.S. Cl.
CPC ............. *H01J 37/04* (2013.01); *C23C 16/4401* (2013.01); *C23C 16/45565* (2013.01); *H01J 37/3255* (2013.01); *H01J 37/32605* (2013.01); *H01J 37/32724* (2013.01); *H01J 2237/032* (2013.01)

(58) Field of Classification Search
CPC .................................. F16B 5/10; F16B 21/02

USPC .................................................... 156/345.34
See application file for complete search history.

(56) References Cited

U.S. PATENT DOCUMENTS 2,984,279 A * 5/1961 Rosan ............................ 411/178
3,137,186 A * 6/1964 Rosan et al. ................. 29/240.5
(Continued)

FOREIGN PATENT DOCUMENTS

JP 3-60930 3/1991
JP 2003297806 A 10/2003
(Continued)

OTHER PUBLICATIONS

Glasgow et al., "Performance Testing of Thermal Interface Filler Materials in a Bolted Aluminum Interface Under ThermalNacuum Conditions", National Aeronautics and Space Administration, Jun. 2003.
(Continued)

*Primary Examiner* — Keath Chen

(57) ABSTRACT

A showerhead electrode is provided where backside inserts are positioned in backside recesses formed along the backside of the electrode. The backside inserts comprise a tool engaging portion. The tool engaging portion is formed such that the backside insert further comprises one or more lateral shielding portions between the tool engaging portion and the threaded outside diameter to prevent a tool engaged with the tool engaging portion of the backside insert from extending beyond the threaded outside diameter of the insert. Further, the tool engaging portion of the backside insert comprises a plurality of torque-receiving slots arranged about the axis of rotation of the backside insert. The torque-receiving slots are arranged to avoid on-axis rotation of the backside insert via opposing pairs of torque-receiving slots.

12 Claims, 6 Drawing Sheets

(51) Int. Cl.
  *C23F 1/00* (2006.01)
  *H01J 37/04* (2006.01)
  *C23C 16/44* (2006.01)
  *C23C 16/455* (2006.01)
  *H01J 37/32* (2006.01)

(56) References Cited

U.S. PATENT DOCUMENTS

| | | | |
|---|---|---|---|
| 3,241,408 A * | 3/1966 | McCauley | 81/436 |
| 3,259,162 A * | 7/1966 | Rosan | 411/109 |
| 3,319,690 A * | 5/1967 | Rosan et al. | 411/178 |
| 3,783,173 A | 1/1974 | Twomey | |
| 3,939,321 A | 2/1976 | Bertrand et al. | |
| 4,480,513 A * | 11/1984 | McCauley et al. | 81/436 |
| 4,545,697 A * | 10/1985 | Verdenne et al. | 403/230 |
| 4,595,484 A | 6/1986 | Giammarco et al. | |
| 4,654,754 A | 3/1987 | Daszkowski | |
| 4,782,893 A | 11/1988 | Thomas | |
| 4,792,378 A | 12/1988 | Rose et al. | |
| 4,820,371 A | 4/1989 | Rose | |
| 4,960,488 A | 10/1990 | Law et al. | |
| 5,232,323 A * | 8/1993 | Baehre | 411/178 |
| 5,420,388 A | 5/1995 | Girardin | |
| 5,435,678 A * | 7/1995 | Stencel | 411/178 |
| 5,518,758 A | 5/1996 | Tiburtius et al. | |
| 5,534,751 A | 7/1996 | Lenz et al. | |
| 5,545,473 A | 8/1996 | Ameen et al. | |
| 5,567,093 A | 10/1996 | Richmond | |
| 5,585,013 A | 12/1996 | Truty | |
| 5,660,917 A | 8/1997 | Fujimori et al. | |
| 5,679,457 A | 10/1997 | Bergerson | |
| 5,766,364 A * | 6/1998 | Ishida et al. | 118/725 |
| 5,860,779 A * | 1/1999 | Toosky et al. | 411/432 |
| 5,932,007 A | 8/1999 | Li | |
| 5,977,503 A | 11/1999 | Leach et al. | |
| 6,036,782 A | 3/2000 | Tanaka et al. | |
| 6,050,216 A | 4/2000 | Szapucki et al. | |
| 6,073,577 A | 6/2000 | Lilleland et al. | |
| 6,096,414 A | 8/2000 | Young | |
| 6,123,775 A | 9/2000 | Hao et al. | |
| 6,131,646 A | 10/2000 | Kelley | |
| 6,165,612 A | 12/2000 | Misra | |
| 6,170,432 B1 | 1/2001 | Szapucki et al. | |
| 6,200,415 B1 * | 3/2001 | Maraschin | 156/345.52 |
| 6,220,607 B1 | 4/2001 | Schneider et al. | |
| 6,245,192 B1 | 6/2001 | Dhindsa et al. | |
| 6,295,900 B1 * | 10/2001 | Julicher et al. | 81/436 |
| 6,331,349 B1 | 12/2001 | Kalinoski et al. | |
| 6,343,647 B2 | 2/2002 | Kim et al. | |
| 6,365,063 B2 | 4/2002 | Collins et al. | |
| 6,376,385 B2 | 4/2002 | Lilleland et al. | |
| 6,379,491 B1 | 4/2002 | Lee et al. | |
| 6,391,787 B1 | 5/2002 | Dhindsa et al. | |
| 6,403,910 B1 | 6/2002 | Stang et al. | |
| 6,412,437 B1 | 7/2002 | Campbell et al. | |
| 6,432,831 B2 | 8/2002 | Dhindsa et al. | |
| 6,468,925 B2 | 10/2002 | Campbell et al. | |
| 6,475,933 B1 | 11/2002 | Brown et al. | |
| 6,491,784 B2 | 12/2002 | Yamaguchi et al. | |
| 6,496,373 B1 | 12/2002 | Chung | |
| 6,651,736 B2 | 11/2003 | Chiu et al. | |
| 6,733,015 B2 | 5/2004 | Forry et al. | |
| 6,786,175 B2 | 9/2004 | Dhindsa et al. | |
| 6,818,097 B2 | 11/2004 | Yamaguchi et al. | |
| 6,824,627 B2 | 11/2004 | Dhindsa et al. | |
| 6,855,377 B2 | 2/2005 | Yajima et al. | |
| 6,983,892 B2 | 1/2006 | Noorbakhsh et al. | |
| 6,984,288 B2 | 1/2006 | Dhindsa et al. | |
| 7,017,269 B2 | 3/2006 | White et al. | |
| 7,018,506 B2 | 3/2006 | Hongoh et al. | |
| 7,048,481 B2 | 5/2006 | Sugata et al. | |
| 7,094,315 B2 | 8/2006 | Chen et al. | |
| 7,137,444 B2 | 11/2006 | Faybishenko et al. | |
| 7,159,537 B2 | 1/2007 | Wickramanayaka et al. | |
| 7,205,050 B2 | 4/2007 | Haas | |
| 7,208,192 B2 | 4/2007 | Bunyan et al. | |
| 7,220,937 B2 | 5/2007 | Hofman et al. | |
| 7,708,859 B2 | 5/2010 | Huang et al. | |
| 7,712,434 B2 | 5/2010 | Dhindsa et al. | |
| 7,723,728 B2 | 5/2010 | Chen et al. | |
| 7,732,728 B2 | 6/2010 | Dhindsa et al. | |
| 7,854,820 B2 | 12/2010 | De La Llera et al. | |
| 8,770,902 B1 * | 7/2014 | Miller | 411/107 |
| 2001/0033059 A1 | 10/2001 | Forry et al. | |
| 2002/0086501 A1 * | 7/2002 | O'Donnell et al. | 438/481 |
| 2002/0106610 A1 | 8/2002 | Hurson | |
| 2002/0123230 A1 | 9/2002 | Hubacek | |
| 2003/0103819 A1 | 6/2003 | Sugata et al. | |
| 2003/0106644 A1 * | 6/2003 | Sirkis et al. | 156/345.48 |
| 2004/0187792 A1 | 9/2004 | Parks | |
| 2005/0028935 A1 | 2/2005 | Wickramanayaka et al. | |
| 2005/0127329 A1 | 6/2005 | Wang et al. | |
| 2005/0133160 A1 | 6/2005 | Kennedy et al. | |
| 2005/0145336 A1 | 7/2005 | Matsushima et al. | |
| 2005/0241765 A1 | 11/2005 | Dhindsa et al. | |
| 2005/0241766 A1 | 11/2005 | Dhindsa et al. | |
| 2006/0054280 A1 | 3/2006 | Jang | |
| 2006/0060138 A1 | 3/2006 | Keller et al. | |
| 2006/0091104 A1 * | 5/2006 | Takeshita et al. | 216/37 |
| 2006/0137607 A1 | 6/2006 | Seo et al. | |
| 2006/0207502 A1 | 9/2006 | Dhindsa et al. | |
| 2006/0229416 A1 | 10/2006 | Walker et al. | |
| 2006/0253942 A1 | 11/2006 | Barrera et al. | |
| 2006/0266852 A1 | 11/2006 | Choi | |
| 2006/0288934 A1 | 12/2006 | Takahashi et al. | |
| 2007/0066038 A1 | 3/2007 | Sadjadi et al. | |
| 2007/0066083 A1 | 3/2007 | Yang et al. | |
| 2007/0068629 A1 | 3/2007 | Shih et al. | |
| 2007/0187038 A1 | 8/2007 | Ren et al. | |
| 2008/0081114 A1 * | 4/2008 | Johanson et al. | 427/273 |
| 2008/0090471 A1 | 4/2008 | De La Llera et al. | |
| 2008/0141941 A1 | 6/2008 | Augustino et al. | |
| 2008/0171444 A1 | 7/2008 | Dhindsa et al. | |
| 2008/0223401 A1 * | 9/2008 | Augustino et al. | 134/3 |
| 2008/0242085 A1 | 10/2008 | Fischer et al. | |
| 2008/0255294 A1 | 10/2008 | Yerushalmi-Rozen | |
| 2008/0308229 A1 | 12/2008 | Patrick et al. | |
| 2008/0318433 A1 | 12/2008 | Dhindsa et al. | |
| 2009/0066035 A1 | 3/2009 | Hurlbert et al. | |
| 2009/0081878 A1 | 3/2009 | Dhindsa | |
| 2009/0095424 A1 | 4/2009 | Bettencourt et al. | |
| 2009/0111276 A1 | 4/2009 | Dhindsa et al. | |
| 2009/0236040 A1 | 9/2009 | Patrick et al. | |
| 2009/0305509 A1 | 12/2009 | Stevenson et al. | |
| 2010/0000683 A1 | 1/2010 | Kadkhodayan et al. | |
| 2010/0000684 A1 | 1/2010 | Choi | |
| 2010/0003824 A1 | 1/2010 | Kadkhodayan et al. | |
| 2010/0003829 A1 | 1/2010 | Patrick et al. | |
| 2010/0040768 A1 | 2/2010 | Dhindsa | |
| 2010/0124822 A1 | 5/2010 | Dhindsa et al. | |
| 2010/0151687 A1 | 6/2010 | Dhindsa et al. | |
| 2010/0159707 A1 | 6/2010 | Huang et al. | |
| 2010/0184298 A1 | 7/2010 | Dhindsa | |
| 2010/0261354 A1 | 10/2010 | Bettencourt et al. | |
| 2011/0042879 A1 | 2/2011 | Kellogg et al. | |

FOREIGN PATENT DOCUMENTS

| | | |
|---|---|---|
| JP | 2006324400 A | 11/2006 |
| JP | 2006324400 A | 11/2006 |
| JP | 2007005491 A | 1/2007 |
| JP | 2007123796 A | 5/2007 |
| JP | 2007123796 A | 5/2007 |
| JP | 2008103589 A | 5/2008 |
| JP | 2008103589 A | 5/2008 |
| KR | 20040007301 A | 1/2004 |
| KR | 20040007301 A | 1/2004 |
| KR | 20050043829 A | 5/2005 |
| KR | 2005-0043829 B1 | 10/2006 |
| KR | 20070015599 A | 2/2007 |
| KR | 1020070015599 A | 3/2007 |

(56) References Cited

FOREIGN PATENT DOCUMENTS

| WO | 2005065186 A2 | 7/2005 |
|---|---|---|
| WO | WO-2005065186 A2 | 7/2005 |

OTHER PUBLICATIONS

The Berquist Company, "Thermal Materials: Sil-Pad Products", http://www/berquistcompany.com/tn_sil_pad-print.cfm?98d+1-294, Jun. 13, 2007.
International Search Report and Written Opinion dated Oct. 6, 2010 pertaining to International application No. PCT/US2010/027273.
Douglas R. McCarter et al., "Design and Fabrication of a Single Crystal Silicon (SCSI) Telescope: a Success Story", (Proceedings Paper) in Optical Materials and Structures Technologies 111 6666 (William A. Goodman and Joseph Robichaud eds., Sep. 17, 2007).
Office Action mailed Sep. 21, 2011 as it relates to U.S. Appl. No. 12/112,112.
Japanese Office Action pertaining to Application No. 2010-528920 dated Sep. 4, 2012.
English Translation of KR 2005-0043829, Oct. 2, 2006, Choi.
Examiners Interview Summary dated Feb. 2, 2011 pertaining to U.S. Appl. No. 12/112,112.
Glasgow et al., "Performance Testing of Thermal Interface Filler Materials in a Bolted Aluminum Interface Under ThermalNacuum Conditions," National Aeronautics and Space Administration, Jun. 2003.
International Search Report and Writen Opinion dated Oct. 6, 2010 pertaining to International Application No. PCT/US2010/027273.
International Search Report and Written Opinion dated Jan. 9, 2009 pertaining to International Application No. PCT/US2008/075676 filed Sep. 9, 2008.
International Search Report and Written Opinion dated Aug. 27, 2009 pertaining to International Application No. PCT/US2009/033060.
International Search Report and Written Opinion dated Nov. 28, 2008 pertaining to International Application No. PCT/US2008/064488.
McCarter, Douglas R., et al., "Design and Fabrication of a Single Crystal Silicon (SCSi) Telescope: A Success Story," (Proceedings Paper), in Optical Materials and Structures Technologies III 6666 (William A. Goodman and Joseph L. Robichaud eds., Sep. 17, 2007).
Notice of Allowance dated Feb. 10, 2012 pertaining to U.S. Appl. No. 12/050,195.
Notice of Allowance dated Dec. 5, 2011 pertaining to U.S. Appl. No. 11/871,586.
The Berquist Company, "Thermal Materials: Sil-Pad Products," http://www/berquistcompany.com/tm_sil_pad-print. cfm?89d+104284, Jun. 13, 2007.
U.S. Advisory Action dated Apr. 20, 2010 pertaining to U.S. Appl. No. 11/871,586.
U.S. Final Office Action dated Feb. 8, 2011 pertaining to U.S. Appl. No. 11/871,586.
U.S. Final Office Action dated Aug. 10, 2011 pertaining to U.S. Appl. No. 11/871,586.
U.S. Final Office Action dated Dec. 21, 2010 pertaining to U.S. Appl. No. 12/050,195.
U.S. Final Office Action dated Dec. 21, 2010 pertaining to U.S. Appl. No. 12/112,112.
U.S. Final Office Action dated Dec. 22, 2011 pertaining to U.S. Appl. No. 12/112,112.
U.S. Non-Final Office Action dated Sep. 22, 2011 pertaining to U.S. Appl. No. 12/050,195.
U.S. Office Action dated Mar. 26, 2010 pertaining to U.S. Appl. No. 11/871,586.
U.S. Office Action dated Mar. 28, 2011 pertaining to U.S. Appl. No. 11/871,586.
U.S. Office Action dated Aug. 25, 2010 pertaining to U.S. Appl. No. 12/050,195.
U.S. Office Action dated Aug. 31, 2010 pertaining to U.S. Appl. No. 12/112,112.
U.S. Office Action dated Sep. 21, 2011 pertaining to U.S. Appl. No. 12/112,112.
U.S. Office Action dated Oct. 20, 2010 pertaining to U.S. Appl. No. 11/871,586.
U.S. Office Action dated Nov. 20, 2009 pertaining to U.S. Appl. No. 11/871,586.
U.S. Appl. No. 11/871,586 field Oct. 12, 2007.
U.S. Appl. No. 12/050,195, filed Mar. 18, 2008.
U.S. Appl. No. 12/112,112, filed Apr. 30, 2008.
U.S. Appl. No. 12/409,984, filed Mar. 24, 2009.
International Search Report and Written Opinion dated May 6, 2010 pertaining to International Application No. PCT/US2009/057421.

* cited by examiner

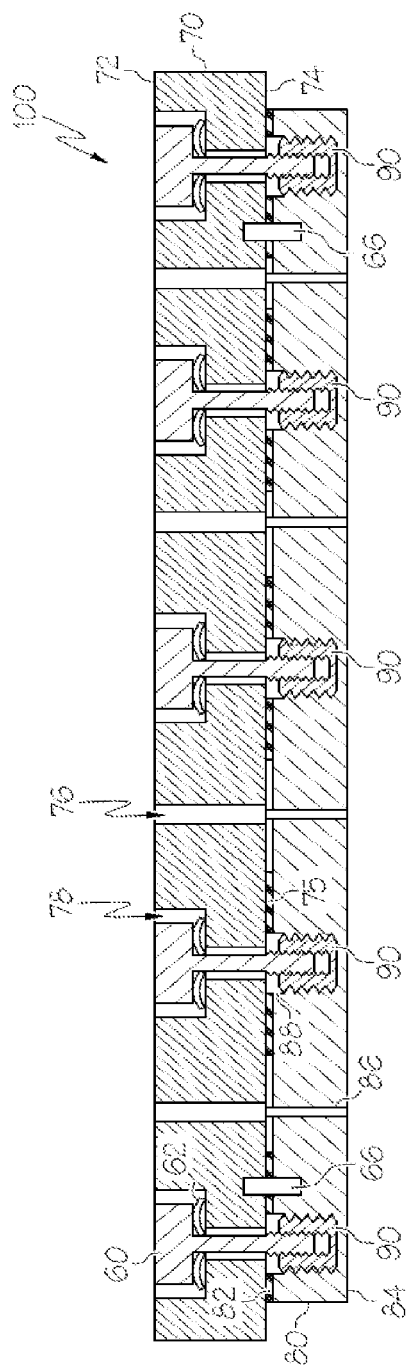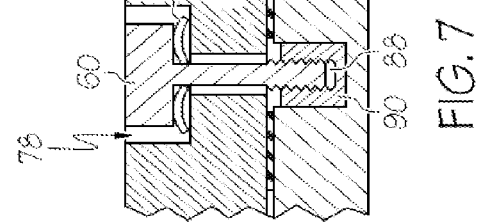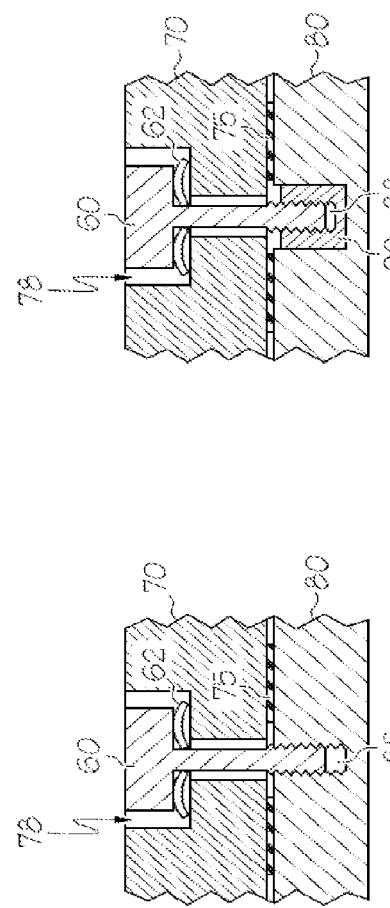

FIG. 12
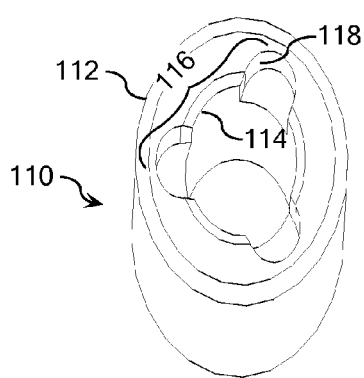
FIG. 13
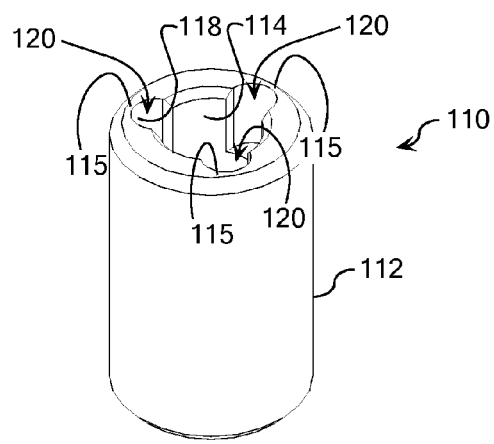
FIG. 14
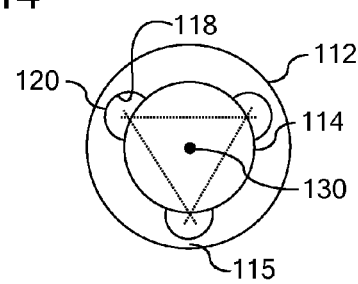
FIG. 15
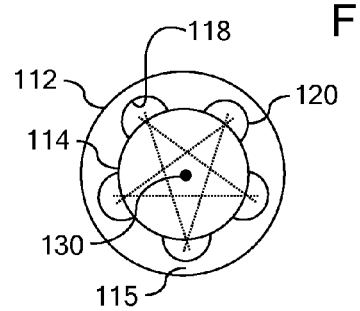
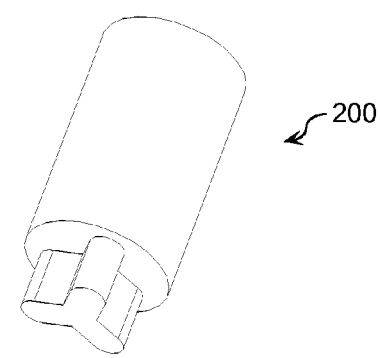
FIG. 16

ANCHORING INSERTS, ELECTRODE ASSEMBLIES, AND PLASMA PROCESSING CHAMBERS

CROSS REFERENCE TO RELATED APPLICATIONS

The present application is a continuation of U.S. application Ser. No. 12/409,984, filed Mar. 24, 2009, now U.S. Pat. No. 8,187,414, entitled "ANCHORING INSERTS, ELECTRODE ASSEMBLIES, AND PLASMA PROCESSING CHAMBERS", which is a continuation-in-part of U.S. patent application Ser. No. 11/871,586, filed Oct. 12, 2007, now U.S. Pat. No. 8,152,954.

This application is related to but does not claim priority to U.S. application Ser. No. 12/112,112, filed Apr. 30, 2008, now U.S. Pat. No. 8,216,418, entitled "ELECTRODE ASSEMBLY AND PLASMA PROCESSING CHAMBER UTILIZING THERMALLY CONDUCTIVE GASKET AND O-RING"; U.S. application Ser. No. 12/050,195, filed Mar. 18, 2008, now U.S. Pat. No. 8,187,413, entitled "ELECTRODE ASSEMBLY AND PLASMA PROCESSING CHAMBER UTILIZING THERMALLY CONDUCTIVE GASKET"; and U.S. application Ser. No. 13/409,527, filed Mar. 1, 2012, now U.S. Pat. No. 8,268,117, entitled "SHOWERHEAD ELECTRODES".

BACKGROUND

The present disclosure relates generally to plasma processing and, more particularly, to plasma processing chambers and electrode assemblies used therein. Plasma processing apparatuses can be used to process substrates by a variety of techniques including, but not limited to, etching, physical vapor deposition, chemical vapor deposition, ion implantation, resist removal, etc. For example, and not by way of limitation, one type of plasma processing chamber contains an upper electrode, commonly referred to as a showerhead electrode, and a bottom electrode. An electric field is established between the electrodes to excite a process gas into the plasma state to process substrates in the reaction chamber.

BRIEF SUMMARY

According to one embodiment of the present disclosure, a showerhead electrode is provided where backside inserts are positioned in backside recesses formed along the backside of the electrode. The showerhead electrode can be a single-piece, circular showerhead or a multi-component, circular showerhead which can include a circular central electrode and one or more peripheral electrodes arranged about the circumference of the central electrode. The backside inserts comprise a threaded outside diameter, a threaded inside diameter, and a tool engaging portion formed in the threaded inside diameter. The tool engaging portion is formed such that the backside insert further comprises one or more lateral shielding portions between the tool engaging portion and the threaded outside diameter to prevent a tool engaged with the tool engaging portion of the backside insert from extending beyond the threaded outside diameter of the insert.

In another embodiment, the tool engaging portion of the backside insert comprises a plurality of torque-receiving slots arranged about the axis of rotation of the backside insert. The torque-receiving slots are arranged to avoid on-axis rotation of the backside insert via opposing pairs of torque-receiving slots.

Additional embodiments relate to plasma processing chambers comprising showerhead electrodes fabricated in the manner disclosed herein.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which:

FIG. 5 is a cross sectional illustration of an electrode assembly including securing hardware according to one embodiment of the present disclosure;

FIGS. 6, 7, 8A, and 9 are cross sectional illustrations of a portion of an electrode assembly including securing hardware according to some alternative embodiments of the present disclosure;

FIGS. 12 and 13 are isometric illustrations of a backside insert according to an additional aspect of the present disclosure;

FIGS. 14 and 15 are schematic illustrations of two alternative ways to arrange torque-receiving slots in a backside insert according to the present disclosure; and FIG. 16 is an isometric illustration of a tool for engaging and rotating the backside insert illustrated in FIGS. 12 and 13.

DETAILED DESCRIPTION

Figure 1:
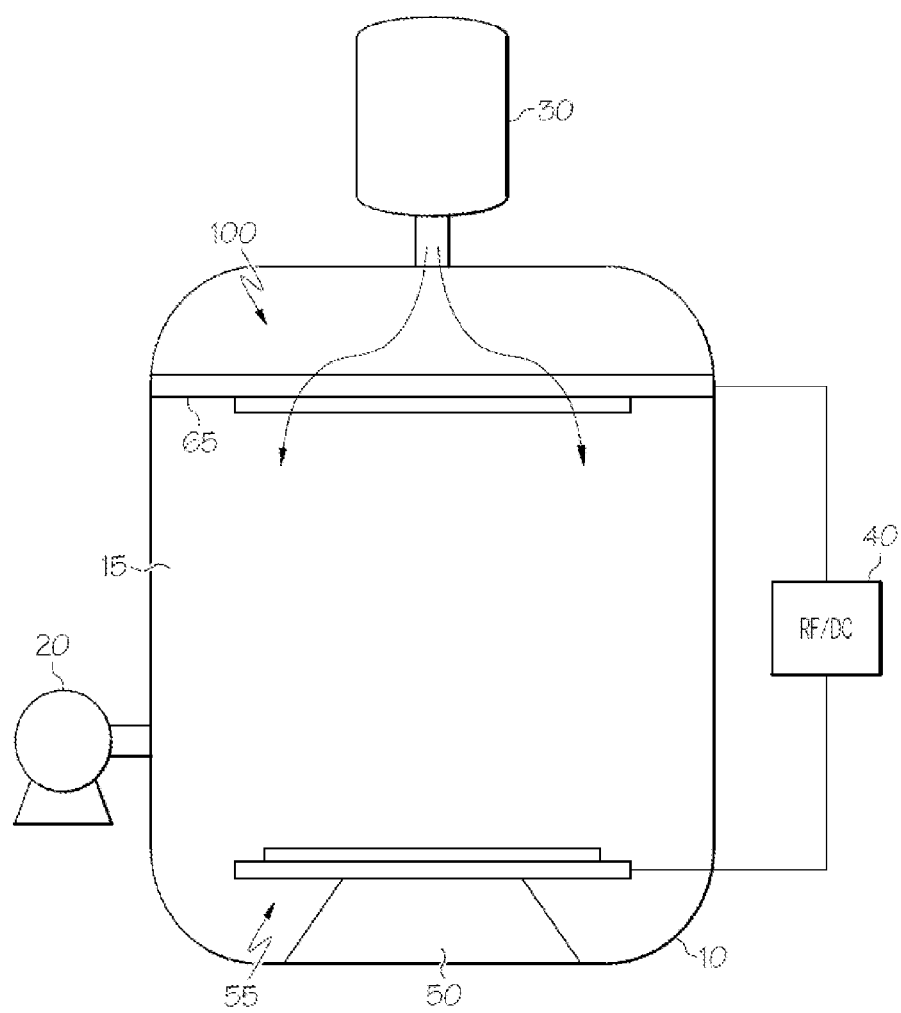
FIG. 1 is a schematic illustration of a plasma processing chamber incorporating particular aspects of some embodiments of the present disclosure.
Figure 2:
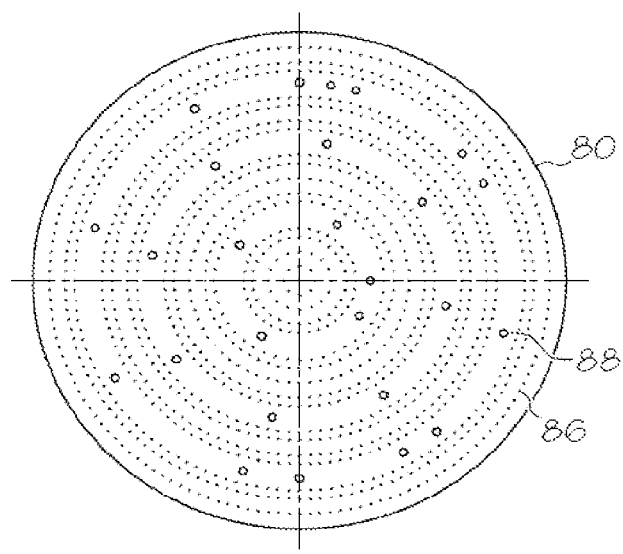
FIG. 2 is a plan view of the backside of a showerhead electrode according to one embodiment of the present disclosure.
Figure 3:
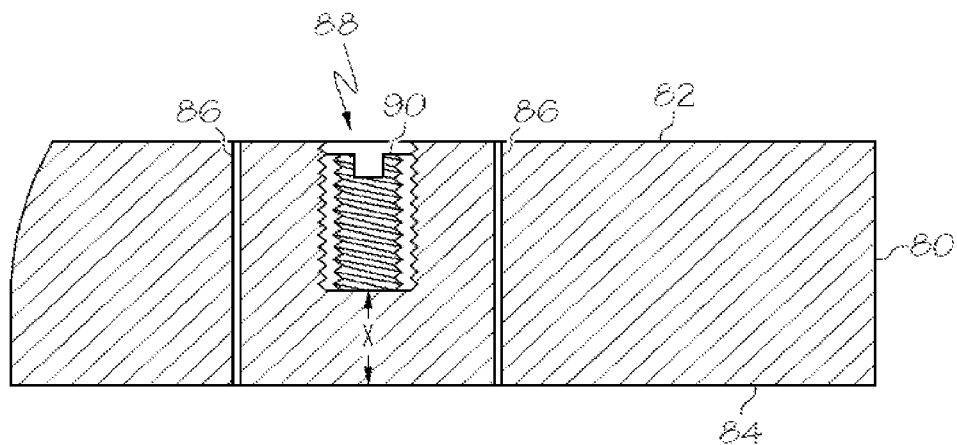
FIG. 3 is a cross-sectional illustration of a portion of a showerhead electrode according to one embodiment of the present disclosure.
Figure 4:
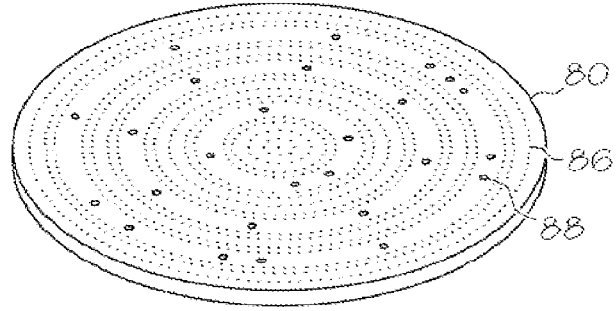
FIG. 4 is an isometric illustration of the backside and thickness dimensions of a showerhead electrode according to one embodiment of the present disclosure.
Figure 8A:
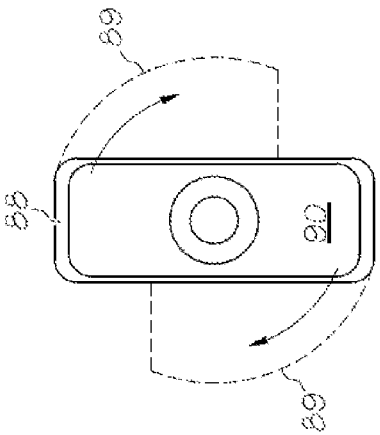
Figure 8B:
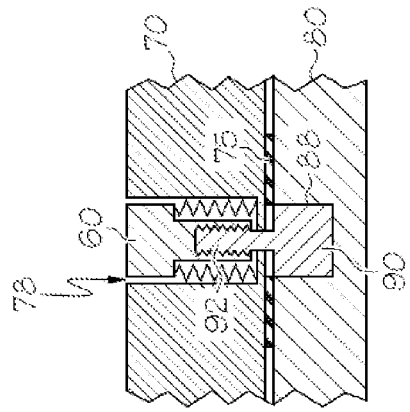
FIGS. 8B and 8C are schematic illustrations presented to clarify the structure and operation of the subject matter illustrated in FIG. 8A.
Figure 8C:
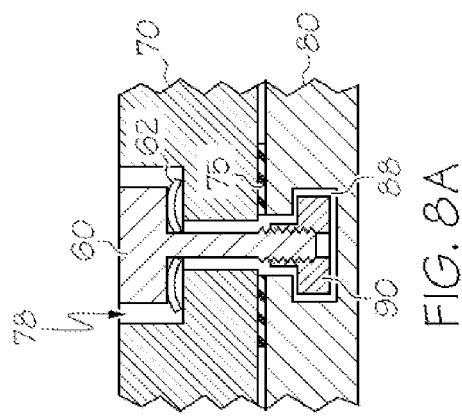

The various aspects of the present disclosure can be illustrated in the context of a plasma processing chamber 10, which is merely illustrated schematically in FIG. 1 to avoid limitation of the concepts of the present disclosure to particular plasma processing configurations, or components, that may not be integral to the subject matter of the present disclosure. As is generally illustrated in FIG. 1, the plasma processing chamber 10 comprises a vacuum source 20, a process gas supply 30, a plasma power supply 40, a substrate support 50 including a lower electrode assembly 55, and an upper electrode assembly 100.

Referring to FIGS. 2-5, an upper electrode assembly 100 according to one embodiment of the present disclosure is illustrated. Generally, the electrode assembly 100 comprises securing hardware 60, alignment pins 66, a thermal control plate 70, a showerhead electrode 80, and a thermally conductive gasket 75 positioned between the frontside 74 of the thermal control plate 70 and the backside 82 of the showerhead electrode 80. More specifically, the thermal control plate 70 comprises a backside 72, a frontside 74, and one or more process gas passages 76 configured to direct process gas to the frontside 74 of the thermal control plate 70. Although the present disclosure is not limited to particular thermal control plate materials or process gas passage configurations, it is noted that suitable thermal control plate materials include aluminum, aluminum alloys, or similar thermal conductors. In addition, it is noted that a variety of teachings may be relied upon in the design of thermal control plates including, but not limited to, U.S. Pub. No. 2005/0133160.

The showerhead electrode 80 comprises a backside 82, a frontside 84, and a plurality of showerhead passages 86 extending from the backside 82 of the showerhead electrode 80 to the frontside 84 of the showerhead electrode 80. The showerhead electrode 80 further comprises a plurality of backside recesses 88 formed in the backside 82 of the electrode 80. As is illustrated in FIG. 5, the backside recesses 88 leave a thickness x of electrode material between the recess 88 and the frontside 84 of the electrode 80. Backside inserts 90 are positioned in the backside recesses along the backside 82 of the electrode 80. The electrode material between the recess 88 and the frontside 84 of the showerhead electrode 80 helps minimize potential source of contamination in the plasma processing chamber 10 by isolating the backside inserts 90 and the securing hardware 60 from reactive species in the plasma chamber. To help ensure that the aforementioned isolation can be maintained over the life of the electrode 80, the thickness x is preferably at least approximately 0.25 cm or, stated differently, at least approximately 25% of the total thickness of the showerhead electrode 80.

Referring to FIG. 1, this isolation can be enhanced by configuring the thermal control plate 70 and the showerhead electrode 80 to define a hermetically sealed plasma partition 65 such that gas and reactive species within the evacuated portion 15 of the plasma processing chamber 10 cannot reach the securing hardware 60 and the inserts. The particular manner in which the plasma partition 65 is defined will vary depending on the respective configurations of the thermal control plate 70 and the showerhead electrode 80. It is contemplated that in most cases, the respective materials forming the thermal control plate 70 and the showerhead electrode 80 will define the majority of the partition. In addition, it is contemplated that a variety of sealing members can be used to enhance the partition, particularly where the thermal control plate 70 and the showerhead electrode 80 interface with each other and with other components of the plasma processing chamber 10.

Referring to FIG. 5, the aforementioned isolation of the backside inserts 90 and the securing hardware 60 from reactive species in the plasma processing chamber 10 can be further enhanced by positioning the backside inserts 90 in the backside recesses 88 such that they are inset or, at least, flush relative to the backside 82 of the showerhead electrode 80. Similarly, the securing hardware 60 can be positioned in securing hardware passages 78 in the thermal control plate 70 such that it is inset or, at least, flush relative to a backside 72 of the thermal control plate 70.

In addition to the process gas passages 76, the thermal control plate 70 comprises securing hardware passages 78 that are configured to permit securing hardware 60 to access the backside inserts 90 positioned in the backside recesses 88 along the backside 82 of the showerhead electrode 80. The thermal control plate 70 and the showerhead electrode 80 can be engaged using the securing hardware 60 and the backside inserts 90. In the engaged state, the frontside 74 of the thermal control plate 70 faces the backside 82 of the showerhead electrode 80 and the showerhead passages 86 in the showerhead electrode 80 are aligned with the process gas passages 76 in the thermal control plate 70. In addition, the securing hardware passages 78 are aligned with the backside inserts 90 positioned in the backside recesses 88 along the backside 82 of the electrode 80. As a result, the securing hardware 60 may extend through the securing hardware passages 78 in the thermal control plate 70 and engage the backside inserts 90, which are positioned in the backside recesses 88 along the backside 82 of the electrode 80.

The securing hardware 60 and the backside inserts 90 are configured to maintain engagement of the thermal control plate 70 and the showerhead electrode 80. In addition, the securing hardware 60 and the backside inserts 90 are configured to permit disengagement of the thermal control plate 70 and the showerhead electrode 80. In the embodiment illustrated in FIG. 5, and other embodiments described herein, the electrode material of the showerhead electrode 80 is isolated from frictional contact with the securing hardware 60 by the relatively resilient material of the backside inserts 90 during engagement and disengagement. This isolation, provided by the backside inserts 90, serves to eliminate abrasion of the electrode material by the securing hardware 60 as a source of contamination in the plasma processing chamber 10. The resiliency of the backside inserts 90 also permit repeated, nondestructive engagement and disengagement of the thermal control plate 70 and the showerhead electrode 80.

Although a variety of materials may be selected to form the backside inserts 90, including thermoplastics or other kinds of plastics, synthetic rubbers, ceramics, metals, or inserts with composite layers of materials, according to some embodiments of the present disclosure, the backside inserts comprise significant amounts of polyetheretherketone (PEEK) formulated and manufactured such that the hardness of the backside inserts 90 does not exceed the hardness of the electrode material. Additional candidate materials include, but are not limited to Delrin® or other acetal resin engineering plastics formulated as filled or unfilled homopolymers or copolymers, nylon, polytetrafluoroethylene (PTFE), or combinations thereof.

Although the thermal control plate 70 and the showerhead electrode 80 can be engaged in a variety of ways consistent with the concepts of the present disclosure, in the embodiments illustrated in FIGS. 5, and 7-11, the backside inserts 90 can be configured as anchors in the backside recesses 88 formed in the backside 82 of the showerhead electrode 80. More specifically, in the embodiment of FIG. 5, the backside insert 90 is anchored in the backside recess by providing a threaded portion in the electrode material. With the insert 90 in place, the securing hardware 60, which may for example comprise a threaded screw or bolt, engages the backside insert 90 to secure the showerhead electrode 80 to the thermal control plate 70. In the embodiment of FIG. 7, the backside insert is anchored in the backside recess via a bonding agent. In the embodiment illustrated in FIGS. 8A-8C, the backside recess 88 is machined to comprise an undercut portion 89 and the backside insert 90 is anchored in the backside recess 88 by inserting the insert 90 into the recess 88 and rotating it into the undercut portion 89 of the backside recess 88.

Figure 9:
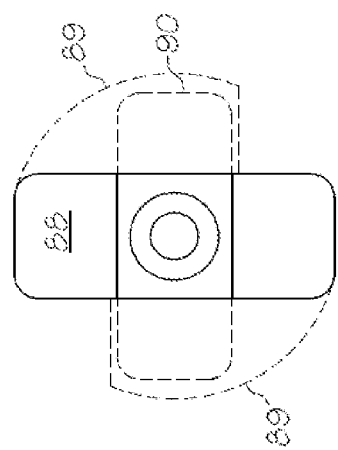

Referring to FIG. 9, it is noted that the backside insert 90 can be configured as a stud comprising a backside extension 92 that is configured to extend into one of the securing hardware passages 78 in the thermal control plate 70. In which case, the securing hardware 60 is configured to access the backside extension 92 of the backside insert 90 in the securing hardware passage 78 via, for example, a threaded engagement.

In any of the embodiments disclosed herein employing one or more backside inserts 90, it will often be advantageous to ensure that the securing hardware 60, the backside inserts 90, and the backside recess 88 are configured such that, during thermal loading, with the securing hardware 60 and backside insert 90 in an engaged state, the backside insert is able to move with the securing hardware within the backside recess without dislodging from the recess. For example, referring to the embodiment of the present disclosure illustrated in FIGS. 10-11, where a refinement of the undercut embodiment illustrated above with reference to FIGS. 8A-8C is illustrated, the backside insert 90 is provided with tabs 95 that are configured to complement the undercut portions 89 formed in the electrode material of the showerhead electrode 80. The insert 90 can be secured in the recess 88 by aligning the tabs 95 with the corresponding grooves 85 in the electrode 80, inserting the insert 90 in the recess 88, and rotating the insert 90, as defined by the grooves 85.

Figure 10:
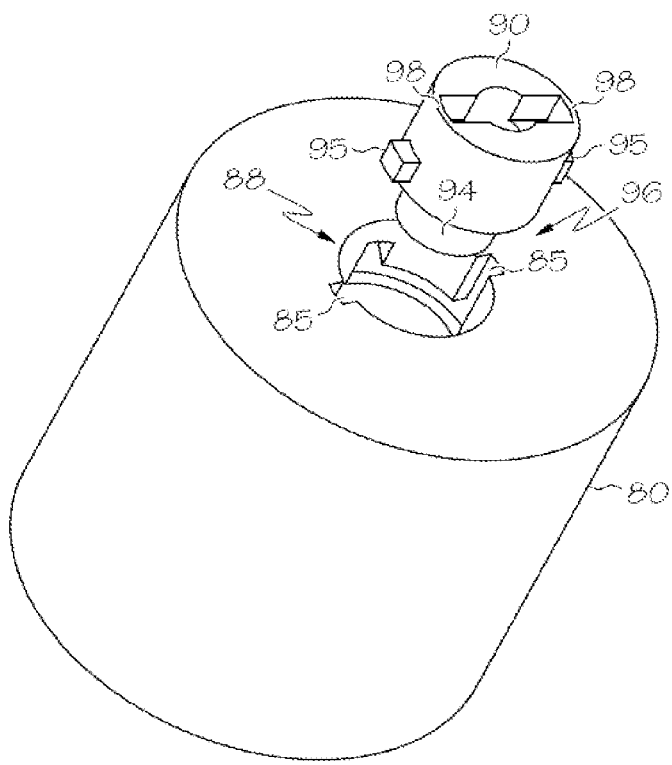
FIGS. 10 and 11 illustrate securing hardware and complementary machined portions of an electrode assembly according to a further alternative embodiment of the present disclosure.
Figure 11:
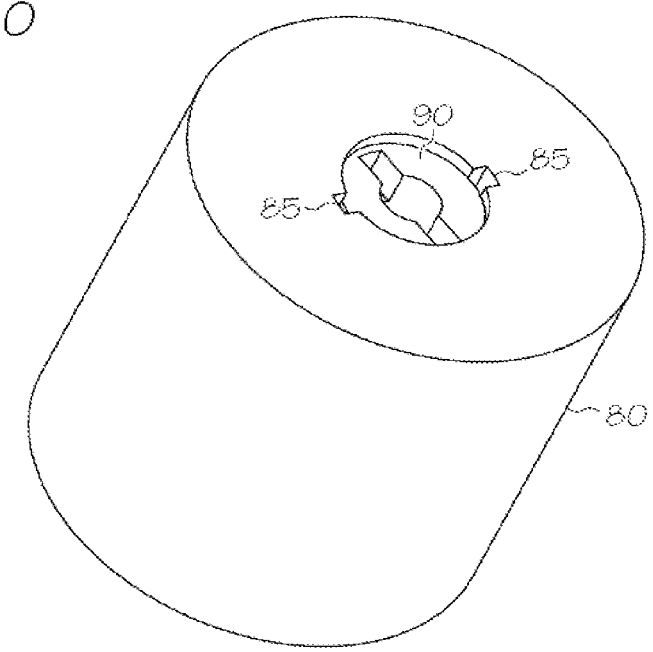

In the embodiment of FIGS. 10 and 11, the insert 90 can be secured in the recess 88 in a spring-loaded state by providing a spring about a reduced diameter portion 94 of the buried end 96 of the insert 90 and the outside diametrical dimensions of the insert 90 and the size and shape of the tabs 95 are chosen to allow for movement of the insert 90 in the backside recess 88 in the spring-loaded state. As a result, during the thermal loading typically present in plasma processing, the backside insert 90 can move with the securing hardware 60 within the backside recess 88 without dislodging from the recess 88 and without degrading the engagement of the securing hardware 60 and the insert 90.

The present inventors have recognized that any abrasive contact with the electrode material in the vicinity of the recesses 88 can create a source of potential contamination in the plasma processing chamber 10. Accordingly, where a backside insert 90 according to the present disclosure is configured for installation or removal with a screwdriver or other potentially abrasive tool, as is the case in the embodiment of FIGS. 10-11, it is contemplated that the slotted driving head of the backside insert 90 can be provided with lateral shielding portions 98 at the edges of the slot or other engaging portion with which the removal tool is to mate. Stated more generally, the backside insert 90 may comprise one or more lateral shielding portions 98 configured to permit a tool to engage the backside insert at a tool engaging portion thereof without extending beyond the periphery of the insert where it could come into contact with the inside diameter of the recess in the electrode material.

A variety of spring-loaded configurations can be utilized to reduce any tendency of the securing hardware 60 to become disengaged as a result of stress induced as a result of thermal loading induced during plasma processing. For example, one configuration for providing a spring-loaded engagement of the thermal control plate 70 and the showerhead electrode 80 is illustrated in FIGS. 5-7. In FIGS. 5 and 7, the backside insert 90 is configured as an anchor in one of the backside recesses 88 formed in the backside 82 of the showerhead electrode 80 and the securing hardware 60 comprises a spring element in the form of a spring-loaded washer 62 configured to oppose a force of engagement provided when the securing hardware 60 accesses the backside insert 90. In FIG. 6, the backside insert is omitted in favor of direct threaded engagement with a tapped hole in the electrode material. Alternatively, as is illustrated in FIG. 9, the spring element can be provided as a helical spring 64 arranged about a longitudinal extension of the securing hardware 60 in the securing hardware passage 78.

FIGS. 12-14 illustrate a backside insert 110 according to an additional embodiment of the present disclosure. As is the case with the embodiments disclosed above, the backside insert 110 illustrated in FIGS. 12-14 can be positioned in the backside recesses along the backside of a showerhead electrode. In the embodiment of FIGS. 12-14, the backside insert 110 comprises a threaded outside diameter 112, a threaded inside diameter 114, and a tool engaging portion 116 formed in the threaded inside diameter 114. As is the case with the backside insert 110 illustrated in FIGS. 10 and 11, the backside insert 110 comprises one or more lateral shielding portions 115 between the tool engaging portion 116 and the threaded outside diameter 112 of the insert 110. The lateral shielding portions 115 help ensure that a tool engaged with the tool engaging portion 116 of the backside insert 110 cannot inadvertently extend beyond the threaded outside diameter 112 of the insert 110. As is noted above, this helps ensure that the tool will not contact the showerhead electrode and dislodge material from the electrode as contaminants.

As is illustrated in FIGS. 12-14, the tool engaging portion 116 of the backside insert 110 comprises a plurality of torque-receiving slots 120 arranged about the axis of rotation 130 of the backside insert 110. To help ensure that users do not attempt to remove the inserts with conventional tools, like flat head and Phillips head screw drivers, the torque-receiving slots 120 are arranged such that attempts to engage opposing pairs of torque-receiving slots 120 with, for example, a flat head screw driver, would result in a cumbersome off-axis rotation of the insert 110. More specifically, as is illustrated by the dashed lines extending between opposing pairs of torque-receiving slots 120 in FIG. 14, any such engagement between opposing pairs of torque-receiving slots, would be strictly off-axis. In contrast, a complementary installation/removal tool 200 of the form illustrated in FIG. 16, would generate the more preferred on-axis rotation about the axis of rotation 130.

Although FIGS. 12-14 and 16 clearly relate to the case where the tool engaging portion 116 of the backside insert 110 comprises three torque-receiving slots 120 arranged about the axis of rotation 130 as three opposing pairs of torque-receiving slots 120, it is contemplated that the tool engaging portion 116 of the backside insert 110 may comprise n torque-receiving slots arranged about an axis of rotation of the backside insert as $n(n-1)/2$ opposing pairs of torque-receiving slots. In FIGS. 14 and 15, the torque-receiving slots 120 are spaced equidistantly about the axis of rotation and n=3 (see FIG. 14) or n=5 (see FIG. 15). In alternate embodiments, it is contemplated that the torque-receiving slots could be spaced equidistantly or non-equidistantly about the axis of rotation and that, in most embodiments, it would be preferable to ensure that three, four, or five slots 120 are provided ($3 \leq n \leq 5$), as some multi-slot configurations could degrade the degree to which on-axis rotation would be avoided.

As is illustrated in FIGS. 12 and 13, the torque-receiving slots 120 descend uniformly into the body of the insert 110 without decreasing in cross sectional size and, as such, can be described as defining a progressively non-constrictive cross sectional profile. In contrast, many conventional hardware screw heads, like a Phillips-type screw head, define a cross sectional profile that constricts with depth to help ensure secure engagement of the screw and screwdriver. The present inventors have recognized, however, that this type of constriction is disadvantageous in the context of the present disclosure because it can lead to excessive frictional contact between the installation/removal tool and the insert and act as a source of particulate contamination.

To further protect against contamination arising from contact between the removal tool and the backside insert 110, it is contemplated that the torque-receiving slots 120 can be designed such that the side walls 118 that extend parallel to the axis of rotation 130 are apex-free side walls. More specifically, the side walls 118 are free of the abrupt geometrical discontinuities that are typically formed when two linear wall segments connect. These geometrical discontinuities, and the complementary counterparts in the matching installation removal tool, can be a significant source of contamination because they typically form relatively fragile or potentially damaging apexes that can either break upon contact or dislodge contaminants from a mating surface in the mechanical engagement context. As is illustrated in FIGS. 12 and 13, although there could be portions of the slots 120 where a curved side wall portion connects with a linear side wall portion, the slot design should be free of linear-to-linear apex-forming connections. As a result, the installation/removal tool 200, an example of which is illustrated in FIG. 16, can also be designed so that it is free of fragile or potentially damaging apexes that are typical of linear-to-linear side wall connections.

Although the various concepts of the present invention have been described herein in the context of electrode materials such as single crystal silicon, polysilicon, silicon nitride, and silicon carbide, it is noted that the present invention has utility in a variety of contexts, including those where the electrode material comprises boron carbide, aluminum nitride, aluminum oxide, or combinations thereof. In addition, it is contemplated that the showerhead electrode 80 may be presented in a variety of configurations without departing from the scope of the present disclosure including, but not limited to, a single-piece, circular showerhead configurations or multi-component, circular showerhead configurations comprising a circular central electrode and one or more peripheral electrodes arranged about the circumference of the central electrode.

It is noted that recitations herein of a component of the present disclosure being "configured" to embody a particular property or function in a particular manner are structural recitations as opposed to recitations of intended use. More specifically, the references herein to the manner in which a component is "configured" denotes an existing physical condition of the component and, as such, is to be taken as a definite recitation of the structural characteristics of the component.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention it is noted that the term "approximately" is utilized herein to represent the inherent degree of uncertainty that may be attributed to any quantitative comparison, value, measurement, or other representation. The term is also utilized herein to represent the degree by which a quantitative representation may vary from a stated reference without resulting in a change in the basic function of the subject matter at issue.

Having described the invention in detail and by reference to specific embodiments thereof, it will be apparent that modifications and variations are possible without departing from the scope of the invention defined in the appended claims.

More specifically, although some aspects of the present invention are identified herein as preferred or particularly advantageous, it is contemplated that the present invention is not necessarily limited to these preferred aspects of the invention.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the open-ended preamble term "comprising."

The invention claimed is:

1. An upper electrode assembly for a plasma processing chamber, the upper electrode assembly comprising:
   a thermal control plate arranged on a gas supply side of the upper electrode assembly, the thermal control plate including
      a plurality of passages through the thermal control plate, each of the plurality of passages including a first upper recessed portion and a second upper recessed portion narrower than the first upper recessed portion; and
   an electrode arranged on a plasma processor chamber side of the upper electrode assembly, the electrode including
      a plurality of lower recessed portions, one of the plurality of lower recessed portions includes an undercut portion with a groove, and
      a plurality of inserts configured to be respectively inserted in the plurality of lower recessed portions, each of the plurality of inserts including an inner threaded surface, wherein one of the plurality of inserts comprises a first portion and a second portion, wherein, when the one of the plurality of inserts is rotated, a tab of the second portion engages with the groove and is slid from a first end of the groove to a second end of the groove,
   wherein each of the plurality of passages through the thermal control plate is configured to receive a securing hardware element,
   wherein upper portions of the securing hardware elements are arranged within the first upper recessed portions and do not extend above an upper surface of the thermal control plate, and
   wherein lower portions of the securing hardware elements extend through the second upper recessed portions into the lower recessed portions of the electrode to engage the inner threaded surfaces of the inserts and secure the thermal control plate to the electrode.

2. The upper electrode assembly of claim 1, further comprising a thermally conductive gasket arranged between the thermal control plate and the electrode.

3. The upper electrode assembly of claim 1, wherein the plurality of lower recessed portions extend less than 75% into a thickness of the electrode.

4. The upper electrode assembly of claim 1, wherein the thermal control plate and the electrode provide a plasma partition that is hermetically sealed to the plasma processing chamber to prevent reactive species within an evacuated portion of the plasma processing chamber from flowing around outer edges of the thermal control plate and contacting the securing hardware elements.

5. The upper electrode assembly of claim 1, wherein the plurality of inserts are recessed with respect to an upper surface of the electrode.

6. The upper electrode assembly of claim 1, wherein a hardness of the plurality of inserts is less than or equal to a hardness of the electrode.

7. The upper electrode assembly of claim 1, further comprising a plurality of spring elements arranged between the upper portions of the securing hardware and respective lower surfaces of the first upper recessed portions.

8. The upper electrode assembly of claim 1, wherein:
each of the plurality of inserts includes a tool engaging portion formed in a corresponding one of the inner threaded surfaces; and
each of the tool engaging portions comprises a plurality of rounded torque-receiving slots arranged about an axis of rotation of a corresponding one of the plurality of inserts.

9. The upper electrode assembly of claim 1, wherein:
the second portion has a larger diameter than the first portion; and
when the one of the plurality of inserts is rotated, the first portion does not rotate into the undercut portion.

10. The upper electrode assembly of claim 1, wherein:
the tab is configured to be inserted in the one of the plurality of inserts at a first end of the undercut portion;
when the one of the plurality of inserts is rotated, the tab is rotated into the undercut portion; and
subsequent to being rotated into the undercut portion, the tab is configured to, via a corresponding one of the securing hardware elements or a spring element, be directed toward the thermal control plate and into the second end of the groove.

11. The showerhead electrode assembly of claim 10, wherein:
the second portion has a larger diameter than the first portion; and
the spring element is mounted on the first portion.

12. The upper electrode assembly of claim 2, wherein:
the thermally conductive gasket comprises a plurality of holes; and
either the secure hardware elements extend respectively through the plurality of holes or gas is directed through the plurality of holes from the gas supply side to the plasma processor chamber side.

\* \* \* \* \*